US010829412B2

(12) United States Patent
Bello et al.

(10) Patent No.: US 10,829,412 B2
(45) Date of Patent: Nov. 10, 2020

(54) CARRIERS FOR MICROELECTRONICS FABRICATION

(71) Applicant: CORNING INCORPORATED, Corning, NY (US)

(72) Inventors: Oladapo Olalekan Bello, Horseheads, NY (US); Donald Arthur Clark, Corning, NY (US); Gregory Scott Glaesemann, Corning, NY (US); Pascale Oram, Hammondsport, NY (US); Charles Donahue Rizzolo, Fairport, NY (US)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 16/446,944

(22) Filed: Jun. 20, 2019

(65) Prior Publication Data
US 2020/0017407 A1 Jan. 16, 2020

Related U.S. Application Data

(60) Provisional application No. 62/697,661, filed on Jul. 13, 2018.

(51) Int. Cl.
| | | |
|---|---|---|
| *B32B 7/02* | (2019.01) | |
| *C03C 21/00* | (2006.01) | |
| *H01L 21/56* | (2006.01) | |
| *H01L 21/683* | (2006.01) | |
| *H01L 23/00* | (2006.01) | |

(52) U.S. Cl.
CPC .......... *C03C 21/002* (2013.01); *H01L 21/568* (2013.01); *H01L 21/6835* (2013.01); *H01L 21/561* (2013.01); *H01L 21/565* (2013.01); *H01L 24/96* (2013.01)

(58) Field of Classification Search
CPC ....... C03C 21/002; C03C 3/087; C03C 3/093; H01L 21/561; H01L 21/565; H01L 21/568; H01L 21/6835; H01L 2221/68345; H01L 2221/68372; H01L 2224/04105; H01L 2224/12105; H01L 24/19; H01L 24/96;
(Continued)

(56) References Cited

U.S. PATENT DOCUMENTS

| | | | |
|---|---|---|---|
| 8,586,492 B2 | 11/2013 | Barefoot et al. | |
| 8,951,927 B2 | 2/2015 | Dejneka et al. | |

(Continued)

OTHER PUBLICATIONS

"AGC Glass Substrate for Semiconductor Packaging"; AGC; Downloaded Sep. 4, 2019; 3 Pages.
(Continued)

*Primary Examiner* — Lawrence D Ferguson
(74) *Attorney, Agent, or Firm* — Amy T. Lang; John P. McGroarty (57) ABSTRACT

Carriers for microelectronics fabrication may include a strengthened substrate formed from glass or glass-ceramic having an average thickness greater than 1.0 mm and less than or equal to 2.0 mm. The strengthened glass substrate may have a single-side surface area greater than or equal to 70,000 mm$^2$. The substrate may also have a compressive stress greater than or equal to 200 MPa and a depth of layer from about 50 μm to about 150 μm. The substrate may further include a tensile stress region having a stored elastic energy of less than 40 kJ/m$^2$ providing for a flat fragmentation factor of less than or equal to 5.

23 Claims, 7 Drawing Sheets

(58) Field of Classification Search
CPC ..... H01L 2924/3511; H01L 2924/3512; B32B 27/02; B32B 7/02
See application file for complete search history.

(56) References Cited

U.S. PATENT DOCUMENTS

| | | |
|---|---|---|
| 8,969,226 B2 | 3/2015 | Dejneka et al. |
| 9,031,813 B2 | 5/2015 | Abbott, III et al. |
| 9,604,876 B2 | 3/2017 | Gy et al. |
| 2012/0297829 A1 | 11/2012 | Endo et al. |
| 2014/0127857 A1 | 5/2014 | Chen et al. |
| 2015/0140325 A1 | 5/2015 | Gross et al. |
| 2016/0102010 A1 | 4/2016 | Beall et al. |
| 2017/0305786 A1 | 10/2017 | Roussev et al. |
| 2017/0349483 A1 | 12/2017 | Gross et al. |
| 2018/0222787 A1 | 8/2018 | Hanawa et al. |
| 2018/0305241 A1 | 10/2018 | Sawamura et al. |
| 2018/0319706 A1 | 11/2018 | Murayama et al. |

OTHER PUBLICATIONS

"AGC Unveils Innovative Glass Substrates for Semiconductor Packaging"; AGC New Release; 2017; 2 Pages.
Hayashi; "Carrier Glass Substrates for Fan-Out Wafer/Panel Level Packaging" ; ICEP 2017 Proceedings; 2017; p. 494-497.
Lau; "Warpage Issues in Fan-Out Wafer Lever Packaging"; 3DINCITIES; (2017); 5 Pages.
International Search Report and Written Opinion of the International Searching Authority; PCT/US2019/038946; dated Sep. 18, 2019, 12 Pgs.

CARRIERS FOR MICROELECTRONICS FABRICATION

This application claims the benefit of priority to U.S. Provisional Application Ser. No. 62/697,661 filed on Jul. 13, 2018, the content of which is relied upon and incorporated herein by reference in its entirety.

BACKGROUND

Field

The present specification generally relates to carriers for use in microelectronics fabrication and, more specifically, to carriers for use in microelectronics fabrication comprising strengthened substrates formed from glass or glass-ceramic.

Technical Background

Carriers are used during the fabrication of microelectronic wafers or panels to support various components as the wafers or panels are "built" layer by layer on the carrier. Conventional fabrication techniques, such as fan-out wafer level packaging (FOWLP) and fan-out panel level packaging (FOPLP), expose the carrier to mechanical stresses, elevated temperatures, and harsh chemical environments, each of which may degrade the performance of conventional carrier made from silicon, rendering the carrier unsuitable for more than a single use.

Accordingly, a need exists for alternative carriers able to withstand the rigors of the microelectronic fabrication process.

SUMMARY

According to various aspects disclosed herein, a carrier for microelectronics fabrication may include a strengthened substrate formed from glass or glass-ceramic. The strengthened substrate may have a first surface, a second surface opposite the first surface and an average thickness between the first surface and the second surface greater than 1.0 mm and less than or equal to 2.0 mm. A single-side surface area of the strengthened substrate may be greater than or equal to 70,000 $mm^2$. The strengthened glass substrate may also include a first compressive stress layer extending inward from the first surface towards a center of the strengthened substrate, the first compressive stress layer having a first depth of layer greater than or equal to 50 µm and less than or equal to 150 µm. A second compressive stress layer may extend inward from the second surface towards the center of the strengthened substrate, the second compressive stress layer having a second depth of layer greater than or equal to 50 µm and less than or equal to 150 µm. A surface compressive stress at the first surface and the second surface of the strengthened substrate may be greater than or equal to 200 MPa. The strengthened substrate may further include a tensile stress region positioned between the first compressive stress layer and the second compressive stress layer, the tensile stress region having a stored elastic energy of less than 40 $kJ/m^2$. A flat fragmentation factor of the strengthened glass substrate may be less than or equal to 5.

Another aspect includes the carrier of any of the foregoing aspects, wherein the surface compressive stress at the first surface and the second surface of the strengthened substrate is less than or equal to 700 MPa.

Another aspect includes the carrier of any of the foregoing aspects, wherein the surface compressive stress at the first surface and the second surface of the strengthened substrate is greater than or equal to 450 MPa and less than or equal to 650 MPa.

Another aspect includes the carrier of any of the foregoing aspects, wherein the first depth of layer and the second depth of layer are greater than or equal to 60 µm and less than or equal to 100 µm.

Another aspect includes the carrier of any of the foregoing aspects, wherein the stored elastic energy in the tensile stress region is less than or equal to 38.8 $kJ/m^2$.

Another aspect includes the carrier of any of the foregoing aspects, wherein the stored elastic energy in the tensile stress region is less than or equal to 38 $kJ/m^2$.

Another aspect includes the carrier of any of the foregoing aspects, wherein the strengthened substrate has a flat fragmentation factor of less than or equal to 3.

Another aspect includes the carrier of any of the foregoing aspects, wherein the first surface has a surface roughness Ra of less than or equal to 1 µm.

Another aspect includes the carrier of any of the foregoing aspects, wherein the strengthened substrate has a transmittance of greater than or equal to 50% for wavelengths of light greater than or equal to 300 nm and less than or equal to 355 nm.

Another aspect includes the carrier of any of the foregoing aspects, wherein the strengthened substrate has a transmittance of greater than or equal to 70% for wavelengths of light greater than or equal to 300 nm and less than or equal to 355 nm.

Another aspect includes the carrier of any of the foregoing aspects, wherein the strengthened substrate has a flexural rigidity greater than or equal to 10 GPa-$mm^3$.

Another aspect includes the carrier of any of the foregoing aspects, wherein the strengthened substrate has a retained strength greater than or equal to 300 MPa after indentation with an indent load of 1 kilogram-force.

Another aspect includes the carrier of any of the foregoing aspects, wherein the strengthened substrate has a retained strength greater than or equal to 100 MPa after indentation with an indent load of 2 kilogram-force.

Another aspect includes the carrier of any of the foregoing aspects, wherein the strengthened substrate has a retained strength greater than or equal to 70 MPa after indentation with an indent load of 3 kilogram-force.

Another aspect includes the carrier of any of the foregoing aspects, wherein the strengthened substrate has a retained strength greater than or equal to 45 MPa after indentation with an indent load of 4 kilogram-force.

Another aspect includes the carrier of any of the foregoing aspects, wherein the strengthened substrate has an average thickness of less than or equal to 1.8 mm.

Another aspect includes the carrier of any of the foregoing aspects, wherein the strengthened substrate has an average thickness of less than or equal to 1.5 mm.

Another aspect includes the carrier of any of the foregoing aspects, wherein the strengthened substrate has an average thickness of less than or equal to 1.1 mm.

Another aspect includes the carrier of any of the foregoing aspects, wherein the strengthened substrate is an ion exchange strengthened substrate.

Another aspect includes the carrier of any of the foregoing aspects, wherein the strengthened substrate comprises a coefficient of thermal expansion greater than or equal to $9 \times 10^{-6}$ $K^{-1}$ averaged over a temperature range from 20° C. to 300° C.

Another aspect includes the carrier of any of the foregoing aspects, wherein the strengthened substrate comprises alkali aluminosilicate glass.

Another aspect includes the carrier of any of the foregoing aspects, wherein the strengthened substrate has an in-process warp of less than or equal to 4,000 µm and greater than or equal to −9,000 µm.

Another aspect includes the carrier of any of the foregoing aspects, wherein the strengthened substrate has an as-formed warp of greater than or equal to 0 µm and less than or equal to 500 µm.

According to some other aspects disclosed herein, a method of forming a carrier for microelectronics fabrication may include immersing a glass or glass-ceramic substrate in a molten salt bath comprising a mixture of from about 90 wt. % to about 98% potassium nitrate and from about 2 wt. % to about 10 wt. % sodium nitrate at a temperature greater than or equal to 380° C. and less than or equal to 460° C. for greater than or equal to 5 hours and less than or equal to 30 hours. The glass or glass-ceramic substrate may include a first surface, a second surface opposite the first surface, a single-side surface area greater than or equal to 70,000 $mm^2$, and an average thickness between the first surface and the second surface greater than 1.0 mm and less than or equal to 2.0 mm.

Another aspect includes the method of any of the foregoing aspects, wherein the molten salt bath comprises a mixture of from about 93 wt. % to about 95 wt. % potassium nitrate and from about 5 wt. % to about 7 wt. % sodium nitrate.

Another aspect includes the method of any of the foregoing aspects, wherein the glass or glass-ceramic substrate is immersed in the molten salt bath at a temperature of about 450° C. for greater than or equal to 6 hours to less than or equal to about 15 hours.

Another aspect includes the method of any of the foregoing aspects, wherein, after the glass or glass-ceramic substrate is immersed in the molten salt bath, the glass or glass-ceramic substrate includes a first compressive stress layer extending inward from the first surface towards a center of the glass or glass-ceramic substrate, the first compressive stress layer having a first depth of layer greater than or equal to 50 µm and less than or equal to 150 µm. The substrate may also include a second compressive stress layer extending inward from the second surface towards the center of the glass or glass-ceramic substrate, the second compressive stress layer having a second depth of layer greater than or equal to 50 µm and less than or equal to 150 µm, wherein a surface compressive stress at the first surface and the second surface of the glass or glass-ceramic substrate is greater than or equal to 200 MPa. The substrate may also include a tensile stress region positioned between the first compressive stress layer and the second compressive stress layer, the tensile stress region having a stored elastic energy of less than 40 $kJ/m^2$. The substrate may also have a flat fragmentation factor less than or equal to 5.

Additional features and advantages of the carriers for microelectronics fabrication described herein and comprising strengthened substrates formed from glass or glass-ceramic will be set forth in the detailed description which follows, and in part will be readily apparent to those skilled in the art from that description or recognized by practicing the embodiments described herein, including the detailed description which follows, the claims, as well as the appended drawings.

It is to be understood that both the foregoing general description and the following detailed description describe various embodiments and are intended to provide an overview or framework for understanding the nature and character of the claimed subject matter. The accompanying drawings are included to provide a further understanding of the various embodiments, and are incorporated into and constitute a part of this specification. The drawings illustrate the various embodiments described herein, and together with the description serve to explain the principles and operations of the claimed subject matter.

DETAILED DESCRIPTION

Figure 2:
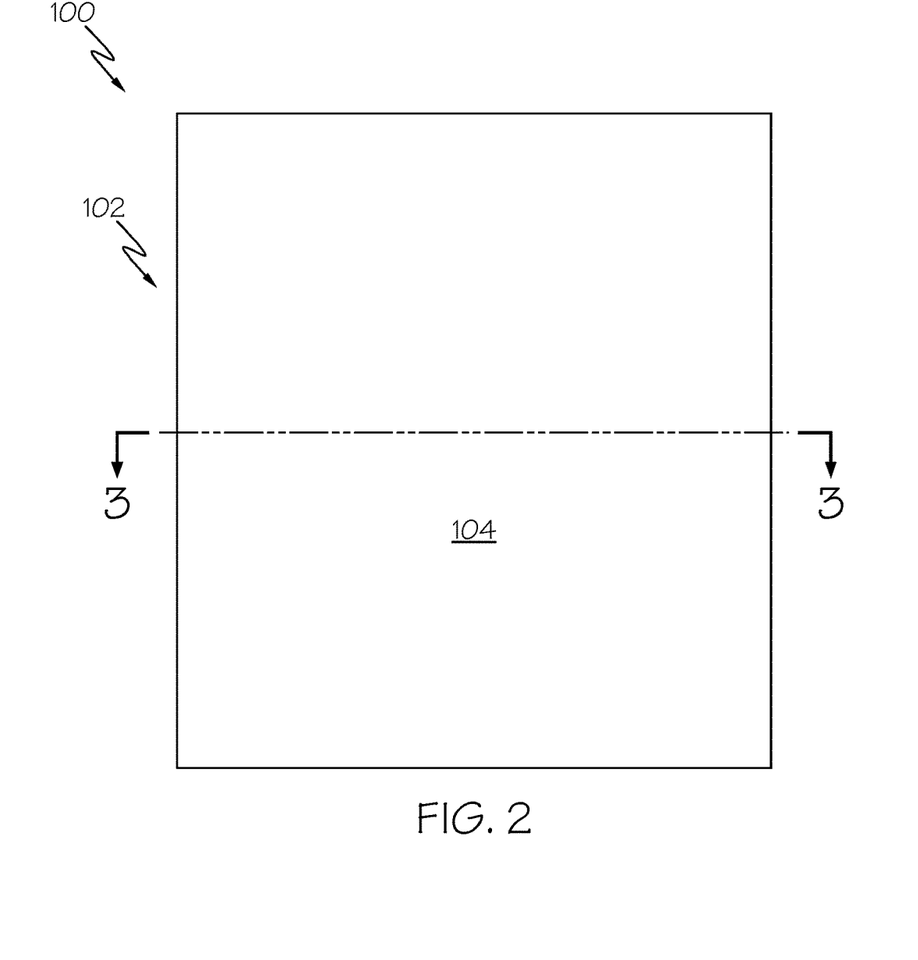
FIG. 2 schematically depicts a top view of a carrier comprising a strengthened substrate formed from glass or glass-ceramic according to one or more embodiments described herein.
Figure 3:
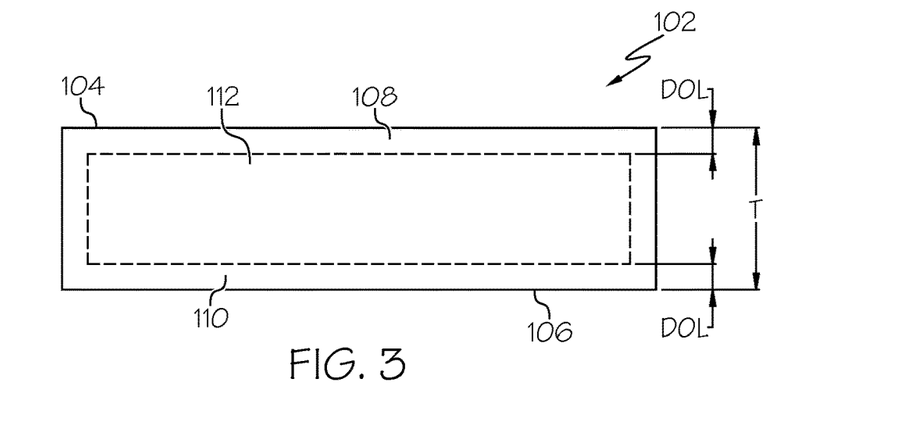
FIG. 3 schematically depicts a cross-sectional view of the carrier of FIG. 2.

Reference will now be made in detail to various embodiments of carriers for microelectronics fabrication comprising strengthened substrates formed from glass or glass-ceramic, examples of which are illustrated in the accompanying drawings. Whenever possible, the same reference numerals will be used throughout the drawings to refer to the same or like parts. One embodiment of a carrier is schematically depicted in FIGS. 2 and 3. The carrier generally includes a strengthened substrate formed from glass or glass-ceramic. The strengthened substrate may have a first surface, a second surface opposite the first surface and an average thickness between the first surface and the second surface greater than 1.0 mm and less than or equal to 2.0 mm. A single-side surface area of the strengthened substrate may be greater than or equal to 70,000 mm². The strengthened glass substrate may also include a first compressive stress layer extending inward from the first surface towards a center of the strengthened substrate, the first compressive stress layer having a first depth of layer greater than or equal to 50 μm and less than or equal to 150 μm. A second compressive stress layer may extend inward from the second surface towards the center of the strengthened substrate, the second compressive stress layer having a second depth of layer greater than or equal to 50 μm and less than or equal to 150 μm. A surface compressive stress at the first surface and the second surface of the strengthened substrate may be greater than or equal to 200 MPa. The strengthened substrate may further include a tensile stress region positioned between the first compressive stress layer and the second compressive stress layer, the tensile stress region having a stored elastic energy of less than 40 kJ/m². A flat fragmentation factor of the strengthened glass substrate may be less than or equal to 5. Various embodiments of carriers for use in microelectronic fabrication comprising strengthened substrates formed from glass or glass-ceramic will be described in further detail herein with specific reference to the appended drawings.

In the following description ranges can be expressed herein as from "about" one particular value, and/or to "about" another particular value. When such a range is expressed, another embodiment includes from the one particular value and/or to the other particular value. Similarly, when values are expressed as approximations, by use of the antecedent "about," it will be understood that the particular value forms another embodiment. It will be further understood that the endpoints of each of the ranges are significant both in relation to the other endpoint, and independently of the other endpoint.

Directional terms as used herein—for example up, down, right, left, front, back, top, bottom—are made only with reference to the figures as drawn and are not intended to imply absolute orientation.

Unless otherwise expressly stated, it is in no way intended that any method set forth herein be construed as requiring that its steps be performed in a specific order, nor that with any apparatus specific orientations be required. Accordingly, where a method claim does not actually recite an order to be followed by its steps, or that any apparatus claim does not actually recite an order or orientation to individual components, or it is not otherwise specifically stated in the claims or description that the steps are to be limited to a specific order, or that a specific order or orientation to components of an apparatus is not recited, it is in no way intended that an order or orientation be inferred, in any respect. This holds for any possible non-express basis for interpretation, including: matters of logic with respect to arrangement of steps, operational flow, order of components, or orientation of components; plain meaning derived from grammatical organization or punctuation, and; the number or type of embodiments described in the specification.

As used herein, the singular forms "a," "an" and "the" include plural referents unless the context clearly dictates otherwise. Thus, for example, reference to "a" component includes aspects having two or more such components, unless the context clearly indicates otherwise.

The term "CTE," as used herein, refers to the coefficient of thermal expansion of the substrate averaged over a temperature range from 20° C. to 300° C.

The elastic modulus (also referred to as Young's modulus) of the substrate is provided in units of gigapascals (GPa). The elastic modulus of the substrate is determined by resonant ultrasound spectroscopy on bulk samples of the substrate.

Compressive stress and depth of layer are determined with a fundamental stress meter (FSM) instrument, such as the FSM-6000, manufactured by Orihara Co., Ltd. (Tokyo, Japan), with the compressive stress value based on the measured stress optical coefficient (SOC). The FSM instrument couples light into and out of the birefringent surface of the substrate. The measured birefringence is then related to stress through a material constant, the stress-optic or photoelastic coefficient (SOC or PEC) and two parameters are obtained: the maximum surface compressive stress (CS) and the exchanged depth of layer (DOL).

Axial transmittance (referred to herein as "transmittance") for wavelengths of ultraviolet light was determined with a Lambda 950 UV/Vis Spectrophotometer manufactured by PerkinElmer Inc. (Waltham, Mass. USA). The Lambda 950 apparatus was fitted with a 150 mm integrating sphere with operating parameters of 2500 nm to 200 nm. The transmittance is reported as a percentage of the intensity of a given wavelength passing through the substrate (i.e., transmittance T=(transmitted intensity/incident intensity)×100).

Figure 1:
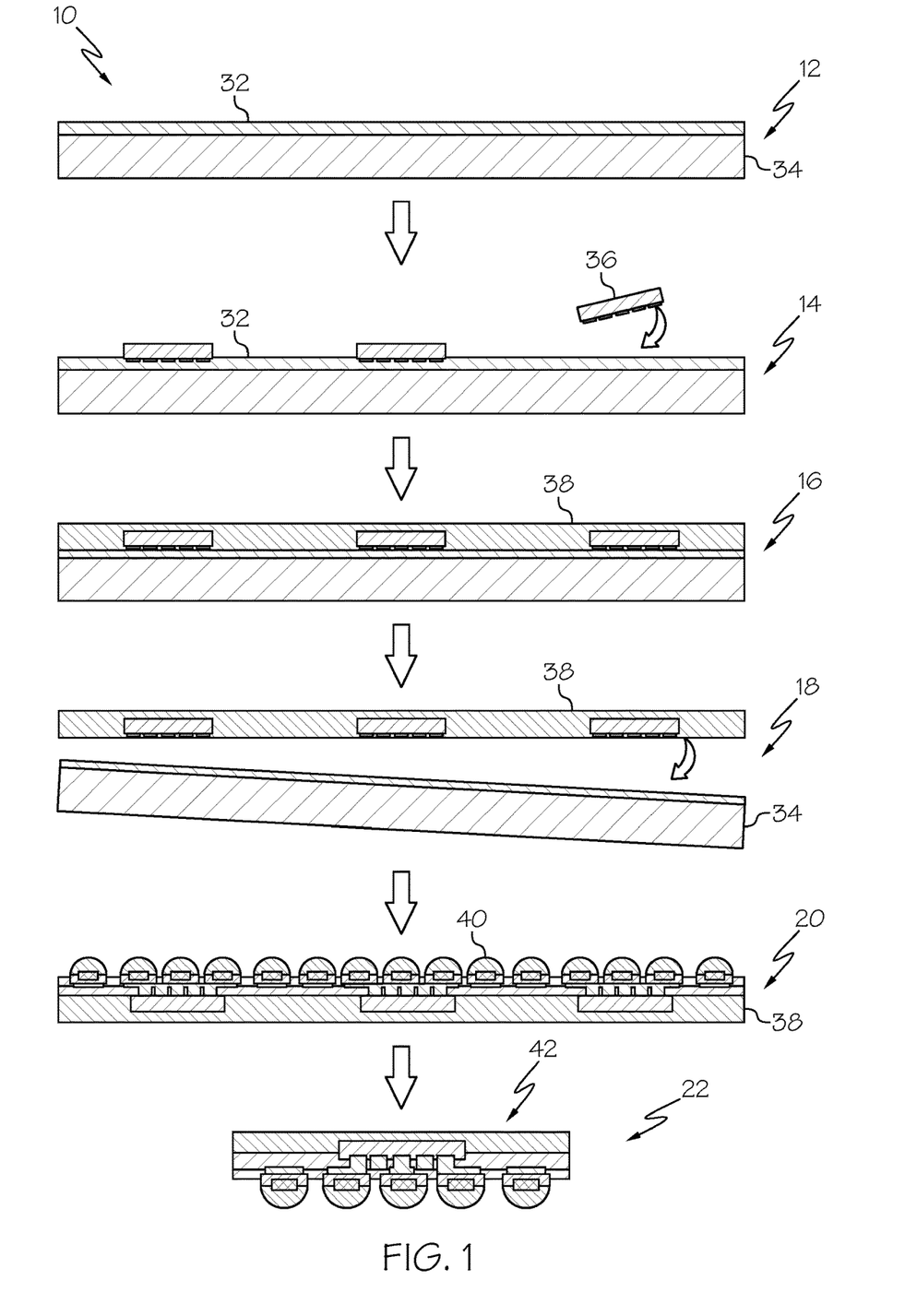
FIG. 1 schematically depicts a process for fabricating microelectronics on a carrier.

Referring now to FIG. 1, a non-limiting example of a microelectronics fabrication process 10 is schematically depicted. The process 10 may be, for example, a fan out process for manufacturing a wafer having microelectronic devices embedded thereon. The process 10 generally includes an initial step 12 of laminating a tape 32 to a carrier 34 comprising a substrate. Conventionally, the substrate of the carrier is formed from, for example, silicon. Thereafter, in step 14, electronic components 36 are placed on the tape 32. A wafer 38 may then be molded over the electronic components 36 in step 16. Thereafter, the carrier 34 may be removed (also referred to as "debonded") from the formed wafer in step 18. In step 20 a ball grid array 40 may be applied to the wafer 38 and, thereafter, the wafer 38 may be diced into discrete microelectronic components 42.

As the size of microelectronic components decreases, there is a need for substrates for carriers with a high degree of surface flatness which facilitates maintaining the close tolerances required for the microelectronic components and wafers formed thereon. In addition, the substrate of the carrier should also facilitate laser de-bonding of the wafer from the substrate and also be able to withstand the stresses and harsh chemical environment of the microelectronics fabrication process.

Glass substrates have been identified as a suitable alternative to conventional carrier substrates formed from silicon due to the superior flatness of the glass substrate, optical transparency at certain wavelengths, dimensional stability, and chemical durability. Indeed, with respect to at least dimensional stability and chemical durability, glass substrates present a significant improvement over conventional carrier substrates, allowing for the glass substrates to be reused in the microelectronic process several times before being discarded.

However, un-strengthened glass substrates are not without drawbacks. In particular, un-strengthened glass substrates used in carriers for microelectronics fabrication may experience a variety of mechanical stresses as various components are pressed and/or molded on the surface of the substrate. These mechanical stresses may ultimately lead to failure of the un-strengthened glass substrate due to fracture. The creation of glass fragments in the fabrication equipment, particularly many small glass fragments, upsets the precision operation of the equipment, necessitating costly equipment downtime to remove the glass fragments. This, in turn, reduces production efficiencies and increases production costs.

The embodiments described herein relate to carriers comprising strengthened substrates for use in microelectronics fabrication. The strengthened substrates are formed from glass or glass-ceramic which mitigates the failure of the substrates due to routine mechanical insults that occur during the microelectronics fabrication process. In the event that the substrates due fail, the strengthened substrates described herein provide for selective failure of the substrates and also reduce the number of fragments created upon failure of the substrate.

Referring now to FIGS. 2 and 3, one embodiment of a carrier 100 is schematically depicted. The carriers 100 described herein include a strengthened substrate 102. Although not depicted, the carrier 100 may further include additional components including, without limitation, coatings, registration features and the like. In the embodiment depicted in FIGS. 2 and 3, the strengthened substrate 102 of the carrier 100 is rectangular or square in shape. However, while FIG. 2 schematically depicts the strengthened substrate 102 as being rectangular or square in cross section, it should be understood that other shapes for the strengthened substrate are contemplated and possible including, without limitation, regular geometrical shapes such as circles, triangles, octagons, and the like, or irregular geometric shapes. In embodiments, the shape of the strengthened substrate may be specifically tailored to provide registration features by which the strengthened substrate can be oriented during microelectronic fabrication processes.

In the embodiments described herein, the strengthened substrate 102 has a first surface 104, a second surface 106 opposite the first surface, and an average thickness T between the first surface 104 and the second surface 106. The strengthened substrate 102 may have a relatively large surface area to maximize the number of microelectronic devices fabricated per carrier. In embodiments, the single-side surface area (i.e., the area of the first surface 104 of the strengthened substrate 102 or the second surface 106 of the strengthened substrate 102) is greater than or equal to 70,000 $mm^2$. For example, in some of these embodiments, the single-side surface area of the strengthened substrate 102 may be greater than or equal to 90,000 $mm^2$ or even greater than or equal to 122,500 $mm^2$. In some of these embodiments, the single-side surface area of the strengthened substrate 102 may be greater than or equal to 160,000 $mm^2$ or even greater than or equal to 202,500 $mm^2$. In some of these embodiments, the single-side surface area of the strengthened substrate 102 may be greater than or equal to 250,000 $mm^2$ or even greater than or equal to 302,500 $mm^2$. In some of these embodiments, the single-side surface area of the strengthened substrate 102 may be greater than or equal to 360,000 $mm^2$ or even greater than or equal to 422,500 $mm^2$. In some of these embodiments, the single-side surface area of the strengthened substrate 102 may be greater than or equal to 490,000 $mm^2$ or even greater than or equal to 562,500 $mm^2$. In some of these embodiments, the single-side surface area of the strengthened substrate 102 may be greater than or equal to 640,000 $mm^2$ or even greater than or equal to 722,500 $mm^2$. In some of these embodiments, the single-side surface area of the strengthened substrate 102 may be greater than or equal to 810,000 $mm^2$ or even greater than or equal to 902,500 $mm^2$. In each of the aforementioned embodiments, the single-side surface area of the strengthened substrate 102 may be less than or equal to 1 $m^2$.

In the embodiments described herein, the average thickness T of the strengthened substrate 102 may be greater than 1.0 mm and less than or equal to 2.0 mm. If the strengthened substrate 102 has an average thickness of less than about 1.0 mm, the substrate may warp or bow significantly during the microelectronic fabrication process which may result in unacceptable process variations. If the strengthened substrate 102 has an average thickness of greater than about 2.0 mm, the thickness of the substrate combined with the thickness of the various layers and components deposited on the substrate may be too large for the spatial constraints of the microelectronic fabrication equipment. In the embodiments of the carrier 100 described herein, the average thickness T of the strengthened substrate 102 may be less than or equal to 1.8 mm, less than or equal to 1.5 mm, or even less than or equal to 1.1 mm.

The strengthened substrates 102 described herein are glass or glass-ceramic and may be formed from a variety of different glass and/or glass-ceramic compositions. In embodiments, the strengthened substrate is formed from alkali aluminosilicate glass compositions. For example, in embodiments, the strengthened substrate may be formed from an alkali aluminosilicate glass composition which comprises: from about 57 mol. % to about 75 mol. % $SiO_2$; from about 7 mol. % to about 17 mol. % $Al_2O_3$; 0 mol. % to about 12 mol. % $B_2O_3$; from about 9 mol. % to about 21 mol. % $Na_2O$; 0 mol. % to about 4 mol. % $K_2O$; 0 mol. % to about 7 mol. % MgO; and 0 mol. % to about 3 mol. % CaO. In a specific embodiment, the strengthened substrate may be formed from an alkali aluminosilicate glass composition which comprises: 69.49 mol. % $SiO_2$, 8.45 mol. % $Al_2O_3$, 14.01 mol. % $Na_2O$, 1.16 mol. % $K_2O$, 0.185 mol. % $SnO_2$, 0.507 mol. % CaO, 6.2 mol. % MgO, 0.01 mol. % $ZrO_2$, and 0.008 mol. % $Fe_2O_3$. In a specific embodiment, the strengthened substrate may be formed from an alkali aluminosilicate glass composition which comprises: 67.55 mol. % $SiO_2$, 3.67 mol. % $B_2O_3$, 12.67 mol. % $Al_2O_3$, 13.66 mol. % $Na_2O$, 0.014 mol. % $K_2O$, 2.33 mol. % MgO, 0 mol. % CaO, 0.008 mol. % $Fe_2O_3$, 0.005 mol. % $ZrO_2$, 0.10 mol. % $SnO_2$).

In embodiments, the strengthened substrate may be formed from an alkali aluminosilicate glass composition which comprises: from about 57 mol. % to about 75 mol. % $SiO_2$; from about 6 mol. % to about 17 mol. % $Al_2O_3$; 0 mol. % to about 15 mol. % $B_2O_3$; 0 mol. % to about 15 mol. % $Li_2O$; 0 mol. % to about 20 mol. % $Na_2O$; 0 mol. % to about 10 mol. % $K_2O$; 0 mol. % to about 8 mol. % MgO; 0 mol. % to about 10 mol. % CaO; 0 mol. % to about 5 mol. % $ZrO_2$; 0 mol. % to about 1 mol. % $SnO_2$; 0 mol. % to about 1 mol. % $CeO_2$; less than about 50 ppm $As_2O_3$; and less than about 50 ppm $Sb_2O_3$; wherein 12 mol. %≤$Li_2O$+$Na_2O$+$K_2O$≤20 mol. % and 0 mol. %≤MgO+CaO≤10 mol. %. In a specific embodiment, the strengthened substrate may be formed from an alkali aluminosilicate glass composition which comprises: 66.16% $SiO_2$, 10.29% $Al_2O_3$, 14.0% $Na_2O$, 2.45% $K_2O$, 0.6 mol. % $B_2O_3$, 0.21% $SnO_2$, 0.58 mol. % CaO, 5.7 mol. % MgO, 0.0105 mol. % $ZrO_2$, and 0.0081 mol. % $Fe_2O_3$. In a specific embodiment, the strengthened substrate may be formed from an alkali aluminosilicate glass composition which comprises: 64.74 mol. % $SiO_2$, 5.14 mol. % $B_2O_3$, 13.94 mol. % $Al_2O_3$, 13.72 mol. % $Na_2O$, 0 mol. % $K_2O$, 2.38 mol. % MgO, 0 mol. % CaO, 0.08 mol. % $SnO_2$.

Suitable glass compositions from which the strengthened substrates may be made further include, for example and without limitation: the glass compositions described in U.S. Pat. No. 8,969,226 entitled "Glasses Having Improved Toughness And Scratch Resistance" and assigned to Corning Incorporated; the glass compositions described in U.S. Pat. No. 8,586,492 entitled "Crack and Scratch Resistant Glass And Enclosures Made Therefrom" and assigned to Corning Incorporated; and the glass compositions described in U.S. Pat. No. 8,951,927 entitled "Zircon Compatible, Ion Exchangeable Glass With High Damage Resistance" and assigned to Corning Incorporated.

As noted herein, the strengthened substrates of the carriers may also be formed from glass-ceramic materials that are amenable to strengthening by ion exchange. Suitable glass-ceramic compositions include, without limitation, the glass-ceramics disclosed in U.S. Patent Publication No. 2016/0102010 entitled "HIGH STRENGTH GLASS-CERAMICS HAVING PETALITE AND LITHIUM SILICATE STRUCTURES" and assigned to Corning Incorporated.

While specific glass or glass-ceramic compositions and/or composition spaces are described it should be understood that these compositions and/or composition spaces are illustrative and that other glass or glass-ceramic compositions are contemplated and possible.

In embodiments, the first surface 104 of the strengthened substrate 102 may be the surface upon which microelectronic components are placed during the microelectronic fabrication process while the second surface 106 of the strengthened substrate 102 is an underside of the carrier 100. In the embodiments described herein, the first surface 104 of the strengthened substrate 102 has a surface roughness Ra of less than or equal to 1 µm or even a surface roughness Ra of less than or equal to 0.5 µm. In some of these embodiments, the first surface 104 has a surface roughness Ra of less than or equal to 0.2 µm or even a surface roughness Ra of less than or equal to 0.1 µm. In some of these embodiments, the first surface 104 of the strengthened substrate 102 has a surface roughness Ra of less than or equal to 0.01 µm.

In some embodiments, the second surface 106 of the strengthened substrate 102 may have the same surface roughness as the first surface 104 of the strengthened substrate 102. In some other embodiments, the second surface 106 of the strengthened substrate 102 may have a surface roughness that is greater than first surface 104 of the strengthened substrate.

The strengthened substrates 102 described herein may be substantially transparent to certain wavelengths of electromagnetic radiation to facilitate the de-bonding of microelectronic components from at least one of the first surface 104 and the second surface 106 of the strengthened substrates. For example, in some embodiments, the strengthened substrates 102 have a transmittance of greater than or equal to 50% for wavelengths of light within the ultraviolet spectrum (i.e., for wavelengths of light from about 10 nm to about 400 nm). If the transmittance of the substrate is less than 50% for wavelengths within this range, de-bonding of the microelectronic components may not be achieved. In some embodiments, the strengthened substrates have a transmittance of greater than or equal to 50% or even greater than or equal to 60% for wavelengths of ultraviolet light greater than or equal to 300 nm and less than or equal to 355 nm. In some of these embodiments, the transmittance may be greater than or equal to 70% or even greater than or equal to 80% for wavelengths of ultraviolet light greater than or equal to 300 nm and less than or equal to 355 nm.

In the embodiments described herein the strengthened substrates have a CTE of greater than or equal to $8 \times 10^{-6}$ $K^{-1}$ averaged over a temperature range from 20° C. to 300° C. or even greater than or equal to $9 \times 10^{-6}$ $K^{-1}$ averaged over a temperature range from 20° C. to 300° C. These CTE values reduce the CTE differential between the substrate and coatings and/or components adhered to the substrate during the microelectronics fabrication process, thereby minimizing distortion of the substrate during thermal cycling experienced during the microelectronics fabrication process.

Still referring to FIGS. 2-3, in the embodiments described herein, the phrase "strengthened substrate" means that, during or following formation of the substrate, the substrate is subjected to processing conditions to introduce compressive stress in the surface of the substrate thereby enhancing the resistance of the substrate to failure-inducing damage. Accordingly, the strengthened substrates described herein further include first and second compressive stress layers 108, 110 that extend from the first surface 104 and the second surface 106 of the strengthened substrate 102, respectively, towards a center of the strengthened substrate 102 to a depth of layer (DOL). The compressive stress in the first compressive stress layer 108 and the second compressive stress layer 110 is generally a maximum at the first surface 104 and the second surface 106 of the strengthened substrate 102 and decreases towards the center of the strengthened substrate 102 until the compressive stress is zero. The depth from the surface at which the compressive stress is zero generally delineates the DOL of the respective first and second compressive stress layers 108, 110. The first compressive stress layer 108 and the second compressive stress layer 110 are separated by a tensile region 112 disposed between the first compressive stress layer 108 and the second compressive stress layer 110.

As noted herein, the compressive stress in the first compressive stress layer 108 and the second compressive stress layer 110 is generally a maximum at the first surface 104 and the second surface 106 of the strengthened substrate 102 and is referred to herein as the surface compressive stress. In the embodiments described herein, the surface compressive stress is generally greater than or equal to 200 MPa such that the strengthened substrate is able to withstand the mechanical insults of the microelectronic fabrication process with relatively low risk of failure. That is, if the surface compressive stress is less than 200 MPa, there is an increased risk that the mechanical insults to the strengthened substrate 102 of the carrier 100 that occur during the microelectronic fabrication process, combined with the stress imposed on the strengthened substrate 102 of the carrier 100 during the processing, would lead to failure of the strengthened substrate 102. In embodiments, the surface compressive stress in the first compressive stress layer 108 and the second compressive stress layer 110 is greater than or equal to 200 MPa and less than or equal to 700 MPa. In some of these embodiments, the surface compressive stress in the first compressive stress layer 108 and the second compressive stress layer 110 is greater than or equal to 450 MPa and less than or equal to 650 MPa.

The first compressive stress layer 108 and the second compressive stress layer 110 each extend to a DOL that is greater than or equal to 50 µm and less than or equal to 150 µm. A DOL of less than 50 µm may not contain the flaws resulting from mechanical insults experienced during the microelectronics fabrication process, thereby leading to failure of the strengthened substrate 102. In some embodiments, the depth of layer is greater than or equal 60 µm and less than or equal to 100 µm.

One consequence of the introduction of compressive stress in the strengthened substrate 102 is the complementary buildup of tensile stress in the tensile region 112. For physical force balance to be maintained, the amount of stored elastic energy (SEE) in both the first and second compressive stress layers 108, 110 and the tensile region 112 must be equal such that the net stress in strengthened substrate is zero. In most cases, the surface compressive stress at the first and second surfaces 104, 106 is relatively large, and the tensile region 112 has a smaller magnitude tensile stress. That is, the compressive stress in the first and second compressive stress layers 108, 110 is distributed over a relatively shallow depth, while the smaller tensile stress is distributed over a significant portion of a thickness T of the substrate.

The energy stored in the tensile region 112 due to the introduction of compressive stress at the surfaces 104, 106 is referred to herein as stored elastic energy (SEE) and is defined by the equation:

$$SEE = (CT^2/E) \cdot (T - 2DOL) \cdot (1-v)$$

where E is the Young's modulus of the strengthened substrate, CT is the central tension, T is the average thickness of the strengthened substrate, v is the Poisson's ratio of the strengthened substrate, and DOL is the depth of layer of the first and second compressive stress layers 108, 110. CT is calculated from the compressive stress (CS), depth of layer (DOL), and the thickness T according to the equation:

$$CT = CS * DOL/(T - 2*DOL)$$

The SEE in the tensile region 112 generally dictates the fragmentation behavior of the strengthened substrate upon failure. That is, if the SEE is above a certain threshold value, the strengthened substrate 102 will separate into many small fragments when a flaw (such as a crack, for example) introduced into the strengthened substrate extends through the DOL of the first or second compressive stress layers 108, 110 and into the tensile region 112. As noted herein, it is undesirable for the strengthened substrate to separate into many small fragments because the small fragments foul the microelectronic fabrication equipment and are difficult to remove, causing process downtime, decreasing manufacturing efficiencies, and increasing manufacturing costs.

However, if the SEE is below a certain threshold value, the strengthened substrate 102 will separate into fewer (and larger) fragments when a flaw (such as a crack, for example) introduced into the strengthened substrate extends through the DOL of the first or second compressive stress layers 108, 110 and into the tensile region 112. These larger fragments can be more readily removed from the microelectronic fabrication equipment reducing process downtime and increasing manufacturing efficiencies.

In the embodiments described herein, the SEE of the strengthened substrate 102 is less than or equal to 40 joules per square meter (kJ/m$^2$) such that the strengthened substrate separates into fewer (and larger) fragments when a flaw (such as a crack, for example) introduced into the strengthened substrate extends through the DOL of the first or second compressive stress layers 108, 110 and into the tensile region 112. In some embodiments, the SEE of the strengthened substrate is less than or equal to 38.8 kJ/m$^2$ or even less than or equal to 38.0 kJ/m$^2$. In some embodiments, the SEE of the strengthened substrate is less than or equal to 37 kJ/m$^2$ or even less than or equal to 35.0 kJ/m$^2$. In some embodiments, the SEE of the strengthened substrate is less than or equal to 33 kJ/m$^2$ or even less than or equal to 30 kJ/m$^2$.

In the embodiments described herein, the compressive stress layers 108, 110 may be formed in the strengthened substrate 102 by several different processes or combinations thereof. For example, the compressive stress layers 108, 110 may be formed in the strengthened substrate by thermal tempering, chemical tempering by ion exchange, and/or lamination of glasses or glass-ceramics having different moduli and/or coefficients of thermal expansion (CTE).

In one particular embodiment, the compressive stress layers 108, 110 are formed through chemical tempering by ion exchange. To achieve the desired stress characteristics (e.g., surface compressive stress, DOL, SEE, etc.), the substrate may be immersed in a molten salt bath comprising alkali metal ions to facilitate exchange of smaller alkali metal ions in the substrate with larger alkali metal ions in the molten salt bath. In an embodiment, the ion exchange process includes placing the substrate in a molten salt bath comprising NaNO$_3$ and KNO$_3$. The concentration of NaNO$_3$ in the molten salt bath may be from about 2 wt. % to about 10 wt. % or even from about 5 wt. % to about 7 wt. %. The concentration of KNO$_3$ in the molten salt bath may be from about 90 wt. % to about 98 wt. % or even from about 93 wt. % to about 95 wt. %. The molten salt bath may be maintained at a temperature from greater than or equal to 380° C. and less than or equal to 460° C., or even from greater than or equal to 400° C. and less than or equal to 450° C. The substrate is positioned in the molten salt bath for a time greater than or equal to 5 hours and less than or equal to 30 hours to achieve the desired stress characteristics. In embodiments, the substrate is positioned in the molten salt bath for a time greater than or equal to 6 hours and less than or equal to 15 hours to achieve the desired stress characteristics.

The CS, central tension, and DOL of the strengthened substrate facilitate singulation of the strengthened substrate with relatively low forces. In particular, the strengthened substrates described herein may be singulated by a scribe-and-break technique using conventional hand tools. For example, a score line may be formed in the surface of the strengthened substrate with a scribe force of less than or equal to 30 Newtons (N) using a conventional glass cutter, such as a Mitsuboshi glass cutter with a standard Penett® wheel. The score line is sufficiently deep that the strengthened substrate can be readily singulated along the score line by applying a bending moment on either side of the score line. Singulation under these conditions occurs without crack bifurcation and, thus, the substrate is cleanly separated along the score line.

The retained strength of the strengthened substrate is a measure of the resistance of the substrate to failure under an applied load after being subjected to a mechanical insult, such as the introduction of a flaw. In the embodiments described herein, the retained strength provides an indication of the ability the substrate to withstand the rigors of the microelectronics fabrication process after being subject to a mechanical insult.

Figure 4:
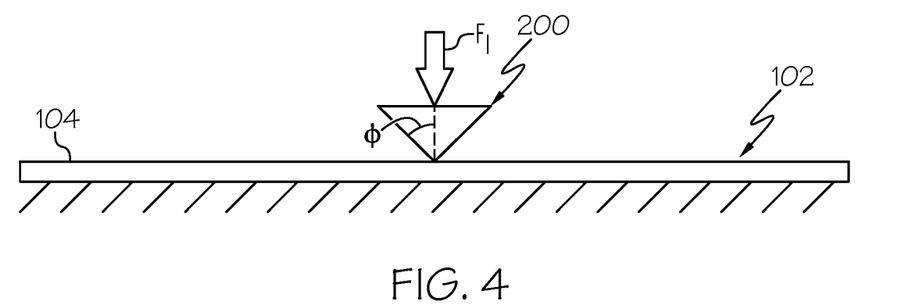
FIG. 4 schematically depicts a cross sectional view of a substrate, such as a strengthened substrate, undergoing indentation with an indenter for purposes of assessing the retained strength of the substrate.
Figure 5:
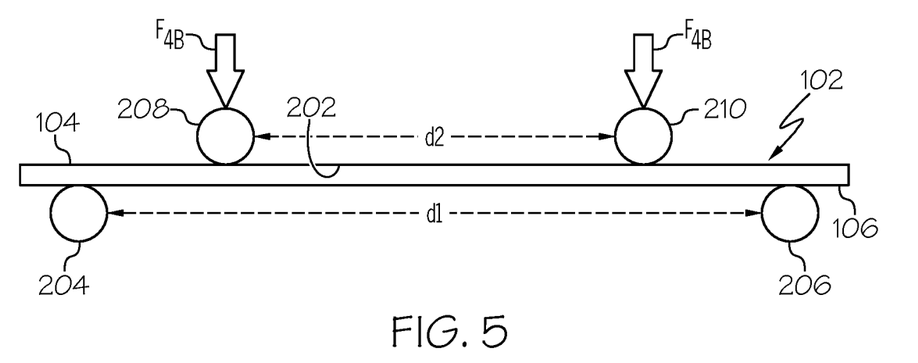
FIG. 5 schematically depicts a cross sectional view of a substrate, such as a strengthened substrate, in 4-point bending for purposes of assessing the retained strength of the substrate following indentation.

Referring now to FIGS. 4 and 5, a process for determining the retained strength of a substrate, such as a strengthened substrate, is schematically depicted. In a first step, an indentation 202 (FIG. 5) is formed in the first surface 104 of the strengthened substrate 102 to simulate a mechanical insult, such as a scratch. The indentation 202 is formed with a pyramidal indenter 200 having a face angle φ of 120°. The indenter 200 is pressed into the first surface 104 of the strengthened substrate with an indent load $F_I$, which, in the embodiments described herein, was varied from 1 kilogram-force to 4 kilogram-force to simulate damage of different severity.

After the indentation 202 is formed in the first surface 104 of the strengthened substrate 102, a bending stress is applied to the strengthened substrate in 4-point bending, as depicted in FIG. 5. Specifically, the strengthened substrate 102 is placed on a pair of support pins 204, 206 such that the support pins contact the second surface 106 of the strengthened substrate 102. The support pins 204,206 are spaced apart from one another by a distance $d_1$. Thereafter, a pair of load pins 208, 210 is brought into contact with the first surface 104 of the strengthened substrate 102 on either side of the indentation 202. The load pins 208, 210 are located within the distance $d_1$ of the support pins 204, 206 but on an opposite side of the strengthened substrate 102 from the support pins 204, 206. The load pins 208, 210 are spaced apart from one another by a distance $d_2$ which is less than the distance $d_1$. Thereafter, a 4-point bend load ($F_{4B}$) is applied to the load pins 208, 210 and increased at a set rate until the strengthened substrate fails (i.e., fractures) from the indentation 202. The 4-point bend load at failure is the retained strength of the substrate for the specific indent load $F_1$ that formed the indentation 202.

In the embodiments described herein, the strengthened substrate has a retained strength of greater than or equal to 300 MPa after indentation with an indent load of 1 kilogram-force (using the method described herein). In embodiments, the strengthened substrate has a retained strength of greater than or equal to 310 MPa or even greater than or equal to 320 MPa after indentation with an indent load of 1 kilogram-force. In some embodiments, the strengthened substrate has a retained strength of greater than or equal to 330 MPa or even greater than or equal to 340 MPa after indentation with an indent load of 1 kilogram-force.

In the embodiments described herein, the strengthened substrate has a retained strength of greater than or equal to 100 MPa after indentation with an indent load of 2 kilogram-force (using the method described herein). In embodiments, the strengthened substrate has a retained strength of greater than or equal to 110 MPa or even greater than or equal to 115 MPa after indentation with an indent load of 2 kilogram-force. In some embodiments, the strengthened substrate has a retained strength of greater than or equal to 120 MPa or even greater than or equal to 130 MPa after indentation with an indent load of 2 kilogram-force. In some embodiments, the strengthened substrate has a retained strength of greater than or equal to 140 MPa or even greater than or equal to 150 MPa after indentation with an indent load of 2 kilogram-force.

In the embodiments described herein, the strengthened substrate has a retained strength of greater than or equal to 70 MPa after indentation with an indent load of 3 kilogram-force (using the method described herein). In embodiments, the strengthened substrate has a retained strength of greater than or equal to 80 MPa or even greater than or equal to 90 MPa after indentation with an indent load of 3 kilogram-force. In some embodiments, the strengthened substrate has a retained strength of greater than or equal to 100 MPa or even greater than or equal to 110 MPa after indentation with an indent load of 3 kilogram-force.

In the embodiments described herein, the strengthened substrate has a retained strength of greater than or equal to 45 MPa after indentation with an indent load of 4 kilogram-force (using the method described herein). In embodiments, the strengthened substrate has a retained strength of greater than or equal to 50 MPa or even greater than or equal to 55 MPa after indentation with an indent load of 4 kilogram-force. In some embodiments, the strengthened substrate has a retained strength of greater than or equal to 60 MPa or even greater than or equal to 65 MPa after indentation with an indent load of 4 kilogram-force. In some embodiments, the strengthened substrate has a retained strength of greater than or equal to 70 MPa or even greater than or equal to 80 MPa after indentation with an indent load of 4 kilogram-force.

As noted herein, it is desirable that the strengthened substrate has sufficient retained strength to avoid failure during the microelectronics fabrication process due to damage (such as mechanical insults, for example). However, if the strengthened substrate does fail, it is desirable that the strengthened substrate separate into as few primary fragments as possible and that the primary fragments are as large as possible to prevent fouling of the microelectronics fabrication equipment and facilitate easy removal of the fragments from the equipment. The term "primary fragments," as used herein, refers to the largest fragments created upon failure of the substrate, exclusive of smaller fragments and particles created at or near the origin of the failure or crack surfaces. In the embodiments described herein, the primary fragments have single-side surface areas that are greater than or equal to ⅛ of the single-side surface area of the substrate prior to fragmentation.

In the embodiments described herein, a "flat fragmentation factor" is used to describe the fragmentation behavior of the substrates. Specifically, the flat fragmentation factor is the number of primary fragments that the strengthened substrate separates into upon failure (i.e., the number of fragments having a single-side surface area that is greater than or equal to ⅛ of the single-side surface area of the strengthened substrate prior to fragmentation). The strengthened substrates described herein have a flat fragmentation factor that is greater than 1 and less than or equal to 5. In embodiments, the strengthened substrates have a flat fragmentation factor that is less than or equal to 4 or even less than or equal to 3. In some embodiments, the strengthened substrates have a flat fragmentation factor of 2.

Figure 6:
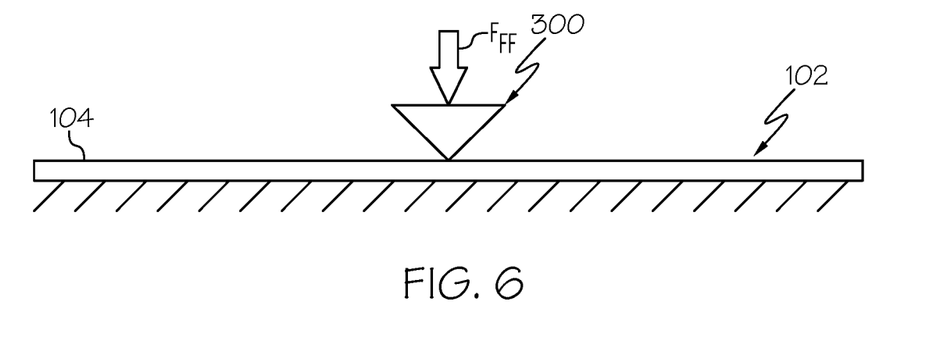
FIG. 6 schematically depicts a cross sectional view of a substrate, such as a strengthened substrate, with an applied flat fragmentation load for purposes of assessing the flat fragmentation factor of the substrate.

Referring now to FIG. 6, the flat fragmentation factor may be determined experimentally. Specifically, FIG. 6 schematically depicts a process for determining the flat fragmentation factor of a glass or glass-ceramic substrate, such as a strengthened substrate 102. This process includes contacting the first surface 104 of the strengthened substrate 102 with a fragmentation indenter (such as a sharp carbide tip or other, similar indenter tool) with a flat fragmentation force $F_{FF}$ at the geometric center of the substrate and increasing the flat fragmentation force until the substrate fails. Thereafter, the number of primary fragments (as determined by single-side surface area of the fragments) is counted and the flat fragment factor is determined.

The strengthened substrates 102 are sufficiently rigid such that they resist flexing under the loads applied to the strengthened substrates 102 during the microelectronics fabrication process. Specifically, the strengthened substrates 102 have a flexural rigidity D that is greater than or equal to 10 GPa-mm³ where D is calculated according to the equation:

$$D = \frac{Et^3}{12(1-v^2)}$$

where E is the elastic modulus of the glass or glass-ceramic, t is the average thickness of the strengthened substrate and ν is Poisson's ratio of the strengthened substrate. If the flexural rigidity is less than 10 GPa-mm³, the strengthened substrate 102 may flex or bend during the microelectronic fabrication process, potentially causing the misalignment of components. In embodiments, the flexural rigidity D of the strengthened substrate greater than or equal to 15 GPa-mm³ or even greater than or equal to 20 GPa-mm³. In some embodiments, the flexural rigidity D of the strengthened substrate greater than or equal to 25 GPa-mm³ or even greater than or equal to 30 GPa-mm³. In some embodiments, the flexural rigidity D of the strengthened substrate greater than or equal to 35 GPa-mm³ or even greater than or equal to 40 GPa-mm³. In some embodiments, the flexural rigidity D of the strengthened substrate greater than or equal to 45 GPa-mm³ or even greater than or equal to 50 GPa-mm³.

In embodiments, the strengthened substrates 102 of the carriers 100 have an as-formed warp of greater than or equal to 0 μm and less than or equal to 500 μm. The phrase "as-formed warp," as used herein, refers to the amount of distortion in the strengthened substrate after strengthening but prior to deposition of any other material on the strengthened substrate 102. In some embodiments, the strengthened substrates 102 have an as-formed warp of greater than or equal to 0 μm and less than or equal to 400 μm or even greater than or equal to 0 μm and less than or equal to 300 μm. In some embodiments, the strengthened substrates 102 have an as-formed warp of greater than or equal to 0 μm and less than or equal to 200 μm or even greater than or equal to 0 μm and less than or equal to 150 μm. In some embodiments, the strengthened substrates 102 have an as-formed warp of greater than or equal to 0 μm and less than or equal to 100 μm or even greater than or equal to 0 μm and less than or equal to 50 μm. In the embodiments described herein the as-formed warp is measured according to the method described in U.S. Pat. No. 9,031,813 entitled "Methods and apparatus for estimating gravity-free shapes."

In the embodiments described herein the strengthened substrates 102 of the carriers 100 have an in-process warp of less than or equal to 4,000 μm and greater than or equal to −9,000 μm. The phrase "in-process warp," as used herein, refers to the amount of distortion in the strengthened substrate as layers of various materials, such as layers of dielectric materials, layers of metallic materials (e.g., copper, silver, etc.), epoxy molding materials, and the like are deposited on the strengthened substrate 102 during the microelectronics fabrication process. The in-process warp may be caused by, for example, the difference in the coefficient of thermal expansion of the strengthened substrate 102 and the various layers deposited on the strengthened substrate 102 as well as the thickness of the strengthened substrate 102 and the thickness of the various layers deposited on the strengthened substrate 102. The in-process warp may also be caused by the cure shrinkage of polymer coating layers. In embodiments, the strengthened substrates have an in-process warp of less than or equal to 3,500 μm and greater than or equal to −8,000 μm. In some embodiments, the strengthened substrates have an in-process warp of less than or equal to 3,000 μm and greater than or equal to −7,000 μm. In some embodiments, the strengthened substrates have an in-process warp of less than or equal to 2,000 μm and greater than or equal to −5,000 μm. In some embodiments, the strengthened substrates have an in-process warp of less than or equal to 1,500 μm and greater than or equal to −4,000 μm. In the embodiments described herein the in-process warp is measured according to the method described in U.S. Pat. No. 9,031,813 entitled "Methods and apparatus for estimating gravity-free shapes."

EXAMPLES

The embodiments described herein will be further clarified by the following examples.

Example 1

The effect of ion exchange process conditions (time, temperature, and bath composition) and sample thickness on the stored elastic energy (SEE) was empirically assessed for samples having a thickness of 2.0 mm and 1.8 mm. The samples were formed from an alkali aluminosilicate glass composition comprising 69.49 mol. % $SiO_2$, 8.45 mol. % $Al_2O_3$, 14.01 mol. % $Na_2O$, 1.16 mol. % $K_2O$, 0.185 mol. % $SnO_2$, 0.507 mol. % CaO, 6.2 mol. % MgO, 0.01 mol. % $ZrO_2$, and 0.008 mol. % $Fe_2O_3$. The samples were ion exchanged in a salt bath comprising $KNO_3$ and $NaNO_3$ with the time and temperature conditions listed in Table 1A.

TABLE 1A

| Ion Exchange Conditions | | | | |
| --- | --- | --- | --- | --- |
| Sample | Time (Hours) | Temp (° C.) | NaNO₃ (wt. %) | KNO₃ (wt. %) |
| 1 | 10 | 450 | 2 | 98 |
| 2 | 8 | 450 | 2 | 98 |
| 3 | 6 | 450 | 2 | 98 |
| 4 | 10 | 450 | 5 | 95 |
| 5 | 8 | 450 | 5 | 95 |
| 6 | 6 | 450 | 5 | 95 |
| 7 | 10 | 450 | 2 | 98 |
| 8 | 8 | 450 | 2 | 98 |
| 9 | 6 | 450 | 2 | 98 |
| 10 | 10 | 450 | 5 | 95 |
| 11 | 8 | 450 | 5 | 95 |
| 12 | 6 | 450 | 5 | 95 |
| 13 | 16 | 450 | 7 | 93 |
| 14 | 14 | 450 | 7 | 93 |
| 15 | 12 | 450 | 7 | 93 |
| 16 | 16 | 450 | 5 | 95 |
| 17 | 14 | 450 | 5 | 95 |
| 18 | 12 | 450 | 5 | 95 |
| 19 | 16 | 450 | 7 | 93 |
| 20 | 14 | 450 | 7 | 93 |
| 21 | 12 | 450 | 7 | 93 |
| 22 | 16 | 450 | 5 | 95 |
| 23 | 14 | 450 | 5 | 95 |
| 24 | 12 | 450 | 5 | 95 |

The samples were then measured to determine the surface compressive stress (CS), depth of layer (DOL), and depth of compression (DOC), the values of which are each reported in Table 1B for the respective samples. Based on this information, the SEE was calculated according to the equation:

$$SEE = (CT^2/E) \cdot (T - 2DOL) \cdot (1 - \nu)$$

where E is the Young's modulus of the glass (71.7 GPa for the samples tested), T is the average thickness of the samples tested, ν is the Poisson's ratio of the glass (0.21 for the samples tested), and DOL is the depth of layer of the compressive stress.

TABLE 1B

| Stored Elastic Energy | | | | |
| --- | --- | --- | --- | --- |
| Sample | Thickness (mm) | CS (MPa) | DOL (μm) | Stored Energy (kJ/m²) |
| 1 | 2.0 | 615.8 | 80.0 | 37.4 |
| 2 | 2.0 | 637.8 | 71.8 | 35.0 |

TABLE 1B-continued

Stored Elastic Energy

| Sample | Thickness (mm) | CS (MPa) | DOL (μm) | Stored Energy (kJ/m²) |
|---|---|---|---|---|
| 3 | 2.0 | 663.0 | 62.6 | 31.9 |
| 4 | 2.0 | 545.3 | 78.9 | 32.7 |
| 5 | 2.0 | 564.7 | 70.8 | 30.6 |
| 6 | 2.0 | 587.1 | 61.7 | 27.9 |
| 7 | 1.8 | 613.3 | 80.0 | 36.9 |
| 8 | 1.8 | 635.5 | 71.8 | 34.6 |
| 9 | 1.8 | 661.0 | 62.6 | 31.6 |
| 10 | 1.8 | 543.1 | 78.9 | 32.3 |
| 11 | 1.8 | 562.8 | 70.8 | 30.3 |
| 12 | 1.8 | 585.3 | 61.7 | 27.7 |
| 13 | 2.0 | 466.1 | 98.2 | 34.2 |
| 14 | 2.0 | 479.6 | 92.0 | 33.2 |
| 15 | 2.0 | 494.4 | 85.4 | 31.9 |
| 16 | 2.0 | 497.8 | 99.1 | 36.9 |
| 17 | 2.0 | 512.2 | 92.9 | 35.1 |
| 18 | 2.0 | 527.9 | 86.2 | 34.3 |
| 19 | 1.8 | 463.8 | 98.2 | 33.8 |
| 20 | 1.8 | 477.4 | 92.0 | 32.8 |
| 21 | 1.8 | 492.2 | 85.4 | 31.5 |
| 22 | 1.8 | 495.2 | 99.1 | 36.4 |
| 22 | 1.8 | 509.8 | 92.9 | 35.3 |
| 24 | 1.8 | 525.6 | 86.2 | 33.9 |

As shown in Table 1B, all of the samples tested had a SEE of less than 38 kJ/m². While not wishing to be bound by theory, it is believed that strengthened glass or glass-ceramic substrates having a SEE of less than 38 kJ/m² will exhibit a flat fragmentation factor of less than or equal to 5 which, in turn, provides for a strengthened substrate that is less prone to failure due to mechanical insults than un-strengthened glass or glass-ceramic due to strengthening but, when subjected to mechanical insults that result in failure, results in fewer primary fragments upon failure than un-strengthened glass or glass ceramic.

Example 2

The fragmentation behavior of un-strengthened substrates and substrates strengthened by ion exchange were compared. The substrates were formed from an alkali aluminosilicate glass comprising 69.49 mol. % $SiO_2$, 8.45 mol. % $Al_2O_3$, 14.01 mol. % $Na_2O$, 1.16 mol. % $K_2O$, 0.185 mol. % $SnO_2$, 0.507 mol. % CaO, 6.2 mol. % MgO, 0.01 mol. % $ZrO_2$, and 0.008 mol. % $Fe_2O_3$. The substrates were square in shape with a length of 500 mm, a width of 500 mm (single-side surface area of 250,000 mm²) and a thickness of 1.8 mm. One set of substrates was ion exchange strengthened in a molten salt bath comprising 95 wt. % $KNO_3$ and 5 wt. % $NaNO_3$ for 10 hours at a temperature of 450° C. The other set of substrates was un-strengthened.

A flat fragmentation test was performed as described herein with respect to FIG. 6. Specifically, the glass substrates were positioned on a table and an indenter was pressed into the surface of the glass substrate at the geometric center of the substrate under an increasing flat fragmentation force $F_{FF}$. The max fragmentation force $F_{FF}$ and condition (i.e., failed/survived) of the substrates are provided below in Table 2. Photographs of a failed strengthened substrate (FIG. 7, rendered as a line drawing) and a failed un-strengthened substrate (FIG. 8, rendered as a line drawing) were taken.

TABLE 2

Flat Fragmentation

| Sample | Strengthened/Unstrengthened | Max $F_{FF}$ (kgf) | Condition (Fail/Survive) |
|---|---|---|---|
| 1 | S | 23.53 | F |
| 2 | S | 35.48 | F |
| 3 | S | 15.91 | F |
| 4 | S | 13.21 | S |
| 5 | S | 10.79 | F |
| 6 | U | 16.89 | S |
| 7 | U | 19.36 | S |
| 8 | U | 28.76 | F |
| 9 | U | 18.43 | S |

Figure 7:
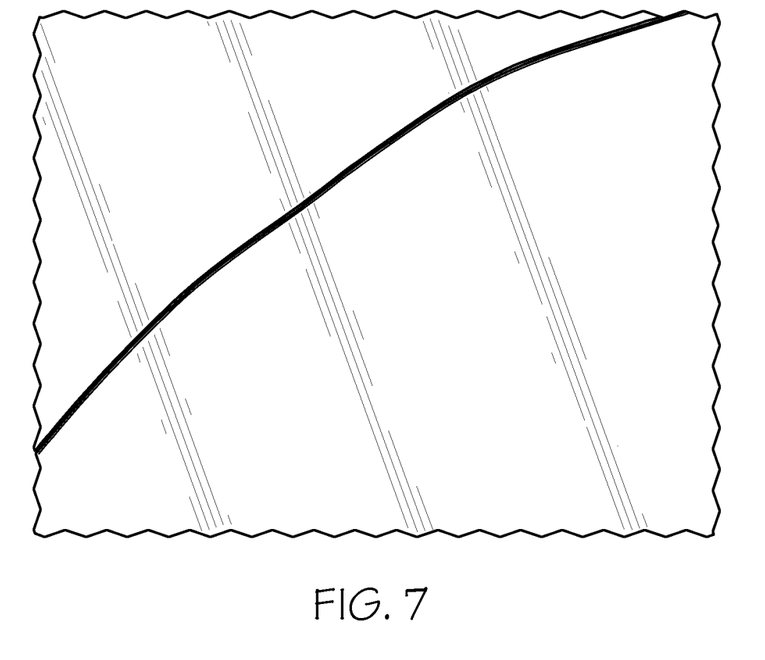
FIG. 7 depicts a drawing (based on a photograph) of a strengthened substrate after flat fragmentation testing showing that the strengthened substrate fragmented into two primary fragments (i.e., the strengthened substrate had a flat fragmentation factor of 2)
Figure 8:
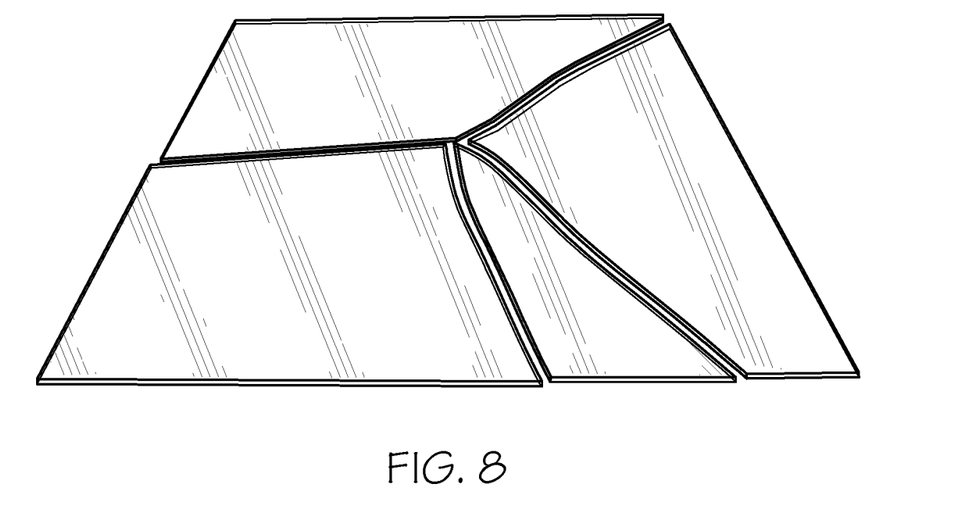
FIG. 8 depicts a drawing (based on a photograph) of an un-strengthened substrate after flat fragmentation testing showing that the un-strengthened substrate fragmented into four primary fragments (i.e., the un-strengthened substrate had a flat fragmentation factor of 4)

As shown in FIG. 7, the strengthened substrate fragmented into two primary fragments and thus had a flat fragmentation factor of 2. In contrast, the un-strengthened substrate (FIG. 8) fragmented into four primary fragments and thus had a flat fragmentation factor of 4. The empirical results of these tests indicate that the strengthened substrates have a better (i.e., lower) flat fragmentation factor than the un-strengthened substrates and, as such are more suitable for use in a microelectronics fabrication processes where fewer fragments are desired to prevent fouling of the fabrication equipment.

Further, as indicated in Table 2, the max fragmentation force $F_{FF}$ at failure for strengthened glass samples was generally less than the max fragmentation force $F_{FF}$ at failure for un-strengthened samples. It is believed that this is due to the introduction of central tension through ion exchange. That is, strengthening of the glass results in the introduction of compressive stress that extends to a depth of layer DOL as well as a tensile region. The glass within the depth of layer is generally resistant to failure from flaws due to the compressive stress in the layer. However, once a flaw penetrates into the tensile region, the tensile stresses in the region will aid in propagating the flaw through the glass, thereby resulting in failure of the glass (i.e., fragmentation).

In contrast, the un-strengthened glass substrates are stress-free (or have much lower compressive/tensile stresses relative the strengthened glass substrates). Absent the tensile region, the indenter must penetrate deeper into the glass substrate (compared to the strengthened glass substrate) to initiate failure and fragmentation. This deeper penetration of the indenter into the glass surface requires greater force, hence the greater max fragmentation force $F_{FF}$ for the un-strengthened glass substrates.

This phenomenon is advantageous when strengthened substrates are employed in carriers in the microelectronics fabrication process. Specifically, the strengthened substrates generally have greater retained strength than un-strengthened substrates (see Example 3). This means that the strengthened substrates are better able to withstand routine mechanical insults (e.g., scratches, nicks, etc.) during the microelectronics fabrication process without failure due to the compressive stress at the surface of the substrate. However, in the event that the mechanical insults are severe (i.e., the scratches, nicks, etc., extend through the depth of layer), the tension in the tensile region of the strengthened substrates will cause the strengthened substrates to preferentially fail and fragment relatively early in the microelectronics fabrication process where stresses are lower and the fragments can be easily removed from the fabrication equipment. Failure at this stage of the fabrication process also mitigates the loss of product layered on the strengthened substrate and reduces equipment downtime.

Example 3

Two sets of alkali aluminosilicate glass samples were empirically tested to compare the effect of ion exchange on the retained strength of the samples. The glass samples had a length of 40 mm, a width of 66 mm, and a thickness of 1.8 mm. A first set of samples was left in as-received condition (i.e., not ion exchange strengthened). A second set of samples was ion exchange strengthened in a mixed salt bath comprising 5 wt. % $NaNO_3$ and 95 wt. % $KNO_3$ for 10 hours at a temperature of 450° C. The ion exchange process resulted in a DOL of 73 μm and a surface compressive stress of 540 MPa. Samples of each set were indented as shown in FIG. 4 with indent loads of 1, 2, 3, and 4 kg-f.

Thereafter, each of the samples was loaded in 4-point bending as depicted in FIG. 5. The 4-point bend load was applied to the load pins at a rate of 5 mm/min to failure for each sample. The results are reported in Table 3 below and plotted in FIG. 9.

TABLE 3

| | Retained Strength | |
| --- | --- | --- |
| Indent Load (kg-f) | Retained Strength (Non-IOX, MPa) | Retained Strength (IOX, MPa) |
| 1 | 48.9 | >348.0 |
| 1 | 49 | >377.3 |
| 2 | 42.1 | 160.6 |
| 2 | 46.4 | 117.9 |
| 2 | 45.6 | 125.8 |
| 2 | 42.5 | 144.2 |
| 3 | 44.05 | 117.87 |
| 3 | 43.86 | 80.21 |
| 3 | 49.1 | 76.63 |
| 3 | 41.75 | 86.53 |
| 4 | 34.98 | 49.82 |
| 4 | 35.43 | 69.37 |
| 4 | 32.86 | 64.18 |
| 4 | 37.17 | 84.49 |

Figure 9:
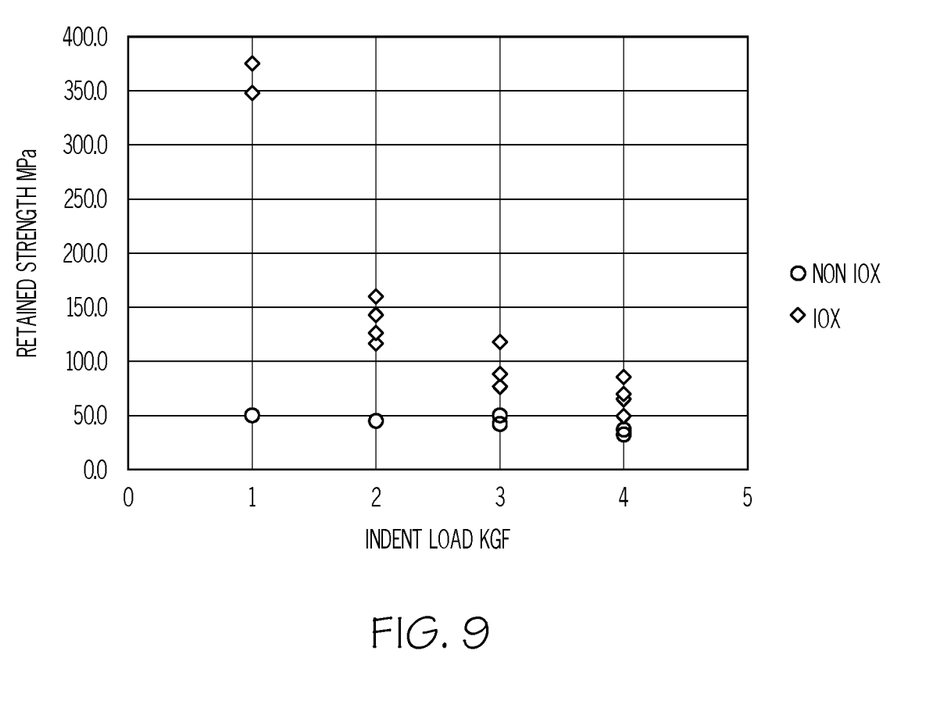
FIG. 9 graphically depicts the retained strength (Y ordinate, in MPa) as a function of indent load (X ordinate, in kilogram-force) for strengthened substrates and un-strengthened substrates.

As graphically illustrated in FIG. 9, the retained strength of the ion exchange strengthened samples and the un-strengthened samples generally decreased with increasing indent loads. However, the retained strength of the ion exchange strengthened samples was approximately twice that of the un-strengthened samples for all indent loading conditions. This data indicates that the ion exchange strengthened samples are better able to withstand the mechanical insults of the microelectronics fabrication processes without failure compared to the un-strengthened substrate.

Example 4

The in-process warp of strengthened substrates with thicknesses of 1.0 mm, 1.5 mm, 2.0 mm, and 3 mm employed in carriers were mathematically modeled. The modeled strengthened substrate was formed from an alkali aluminosilicate glass substrate comprising 66.16% $SiO_2$, 10.29% $Al_2O_3$, 14.0% $Na_2O$, 2.45% $K_2O$, 0.6 mol. % $B_2O_3$, 0.21% $SnO_2$, 0.58 mol. % CaO, 5.7 mol. % MgO, 0.0105 mol. % $ZrO_2$, and 0.0081 mol. % $Fe_2O_3$. The glass substrate was modeled with an elastic modulus of 73.3 GPa, a CTE of $9.4 \times 10^{-6}$ $K^{-1}$ and a poisson ratio of 0.21. The strengthened substrate was modeled with a length of 500 mm and a width of 500 mm.

The in-process warp of the strengthened substrates was modeled with an applied metal/dielectric coating comprising 8 alternating layers of copper (4 layers, each with a 10 μm thickness) and dielectric material (4 layers, each with a 30 μm thickness). The copper was modeled with an elastic modulus of 102.1 GPa, a CTE of $16.5 \times 10^{-6}$ $K^{-1}$, and a poisson ratio of 0.34. The dielectric material was modeled with an elastic modulus of 3.4 GPa below the glass transition temperature of the material (330° C.), an elastic modulus of 0.0034 GPa above the glass transition temperature of the material, a CTE of $35 \times 10^{-6}$ $K^{-1}$ below the glass transition temperature, a CTE of $50 \times 10^{-6}$ $K^{-1}$ above the glass transition temperature, and a poisson ratio of 0.35. The stress-free temperature of the dielectric material was modeled at its glass transition temperature (330° C.) since the curing temperature (375° C.) is higher than its glass transition temperature.

The in-process warp of the strengthened substrates with the applied metal/dielectric coating, as described above, were also modeled with a 0.5 mm thick layer of epoxy molding compound applied over the metal dielectric coating. In one model, a first epoxy molding compound (EMC A) was modeled with an elastic modulus of 22 GPa below the glass transition temperature of the material (165° C.), an elastic modulus of 0.022 GPa above the glass transition temperature of the material, a CTE of $7.5 \times 10^{-6}$ $K^1$ below the glass transition temperature, a CTE of $33 \times 10^{-6}$ $K^{-1}$ above the glass transition temperature, and a poisson ratio of 0.35. In a second model, a second epoxy molding compound (EMC B) was modeled with an elastic modulus of 27 GPa below the glass transition temperature of the material (175° C.), an elastic modulus of 0.027 GPa above the glass transition temperature of the material, a CTE of $7.2 \times 10^{-6}$ $K^{-1}$ below the glass transition temperature, a CTE of $30 \times 10^{-6}$ $K^{-1}$ above the glass transition temperature, and a poisson ratio of 0.35. The stress-free temperature of EMC A and EMC B were modeled at their post mold curing temperatures (125° C.) since the post mold curing temperatures are lower than their glass transition temperatures.

Figure 10:
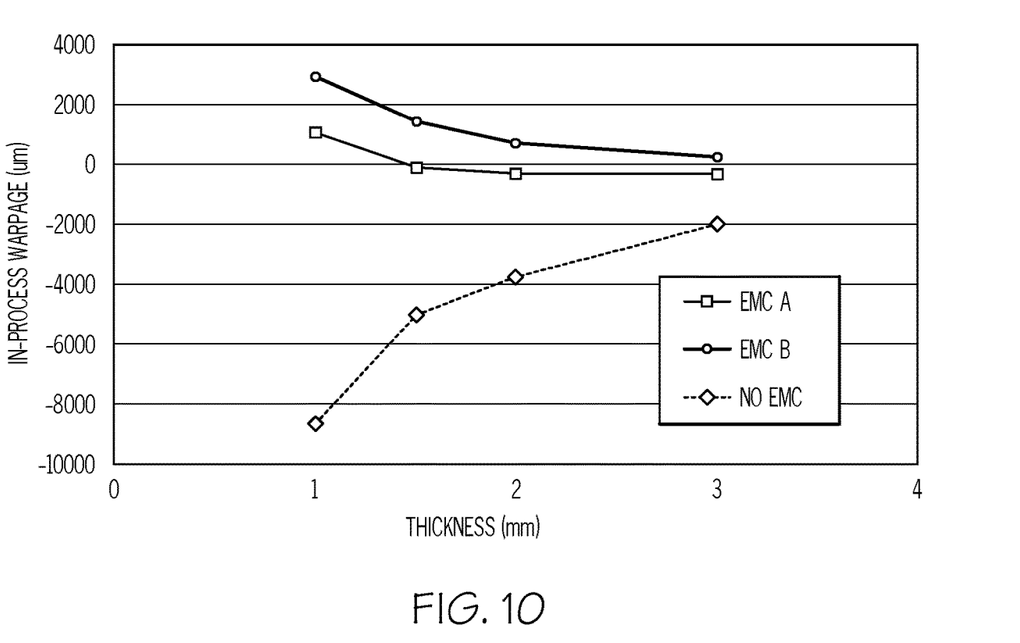
FIG. 10 graphically depicts the in-process warpage (Y ordinate, in µm) as a function of substrate thickness (X ordinate, in millimeters) for substrates of different thicknesses and with different coatings applied.

The warpage (Y ordinate, in μm) as a function of glass thickness (X ordinate, in mm) of the modeled strengthened substrates is graphically depicted in FIG. 10. Specifically, FIG. 10 depicts the warpage of a modeled strengthened substrate with only the metal/dielectric coating (identified as "No EMC"), the warpage of a modeled strengthened substrate with the metal/dielectric coating and the first epoxy molding compound (identified as "EMC A"), and the warpage of a modeled strengthened substrate with the metal/dielectric coating and the second epoxy molding compound (identified as "EMC B").

As shown in FIG. 10, the "No EMC" model had a warpage of less than zero, specifically from about −9,000 μm to about −2000 μm with the warpage approaching zero with increasing thickness of the strengthened substrate. The negative warpage leads to a concave shape in the strengthened substrate. While not wishing to be bound by theory, it is believed that the negative warpage in the "No EMC" model is due to tensile thermal stress within the dielectric material.

In contrast, the "EMC B" model had a warpage of greater than zero, specifically from about 3,000 μm to approximately 0 μm with the warpage decreasing with increasing thickness of the strengthened substrate. The positive warpage leads to a convex shape in the strengthened substrate. While not wishing to be bound by theory, it is believed that the positive warpage in the "EMC B" model is due to compressive thermal stress from the second epoxy molding compound.

The "EMC A" model had warpage greater than zero transitioning to warpage of less than 0 with increasing glass thickness. Specifically, the "EMC A" model had a warpage of approximately 1,000 µm at a glass thickness of 1 mm. This warpage decreased to approximately 0 µm at a glass thickness of 0 mm and further decreased to less than 0 µm for glass thicknesses of greater than 1.5 mm. While not wishing to be bound by theory, it is believed that the warpage for glass thicknesses of 1.5 mm or less is due to compressive thermal stresses in the first epoxy molding compound. However, as the thickness of the glass increases, the effects of the compressive thermal stresses in the first epoxy molding compound becomes negligible due to the increased rigidity of the glass. With the diminished effect of the compressive thermal stresses, the tensile thermal stresses in the dielectric material cause negative warpage. This negative warpage approached 0 µm with increasing glass thickness.

It will be apparent to those skilled in the art that various modifications and variations can be made to the embodiments described herein without departing from the spirit and scope of the claimed subject matter. Thus it is intended that the specification cover the modifications and variations of the various embodiments described herein provided such modification and variations come within the scope of the appended claims and their equivalents.

What is claimed is:

1. A carrier comprising:
  a strengthened substrate formed from glass or glass-ceramic having a first surface, a second surface opposite the first surface and an average thickness between the first surface and the second surface greater than 1.0 mm and less than or equal to 2.0 mm, the strengthened substrate comprising:
    a single-side surface area greater than or equal to 70,000 mm$^2$;
    a first compressive stress layer extending inward from the first surface towards a center of the strengthened substrate, the first compressive stress layer having a first depth of layer greater than or equal to 50 µm and less than or equal to 150 µm;
    a second compressive stress layer extending inward from the second surface towards the center of the strengthened substrate, the second compressive stress layer having a second depth of layer greater than or equal to 50 µm and less than or equal to 150 µm, wherein a surface compressive stress at the first surface and the second surface of the strengthened substrate is greater than or equal to 200 MPa;
    a tensile stress region positioned between the first compressive stress layer and the second compressive stress layer, the tensile stress region having a stored elastic energy of less than 40 kJ/m$^2$; and
    a flat fragmentation factor less than or equal to 5.

2. The carrier of claim 1, wherein the surface compressive stress at the first surface and the second surface of the strengthened substrate is less than or equal to 700 MPa.

3. The carrier of claim 1, wherein the surface compressive stress at the first surface and the second surface of the strengthened substrate is greater than or equal to 450 MPa and less than or equal to 650 MPa.

4. The carrier of claim 1, wherein the first depth of layer and the second depth of layer are greater than or equal to 60 µm and less than or equal to 100 µm.

5. The carrier of claim 1, wherein the stored elastic energy in the tensile stress region is less than or equal to 38.8 kJ/m$^2$.

6. The carrier of claim 1, wherein the stored elastic energy in the tensile stress region is less than or equal to 38 kJ/m$^2$.

7. The carrier of claim 1, wherein the strengthened substrate has a flat fragmentation factor of less than or equal to 3.

8. The carrier of claim 1, wherein the first surface has a surface roughness Ra of less than or equal to 1 µm.

9. The carrier of claim 1, wherein the strengthened substrate has a transmittance of greater than or equal to 50% for wavelengths of light greater than or equal to 300 nm and less than or equal to 355 nm.

10. The carrier of claim 1, wherein the strengthened substrate has a transmittance of greater than or equal to 70% for wavelengths of light greater than or equal to 300 nm and less than or equal to 355 nm.

11. The carrier of claim 1, wherein the strengthened substrate has a flexural rigidity greater than or equal to 10 GPa-mm$^3$.

12. The carrier of claim 1, wherein the strengthened substrate has a retained strength greater than or equal to 300 MPa after indentation with an indent load of 1 kilogram-force.

13. The carrier of claim 1, wherein the strengthened substrate has a retained strength greater than or equal to 100 MPa after indentation with an indent load of 2 kilogram-force.

14. The carrier of claim 1, wherein the strengthened substrate has a retained strength greater than or equal to 70 MPa after indentation with an indent load of 3 kilogram-force.

15. The carrier of claim 1, wherein the strengthened substrate has a retained strength greater than or equal to 45 MPa after indentation with an indent load of 4 kilogram-force.

16. The carrier of claim 1, wherein the strengthened substrate has an average thickness of less than or equal to 1.8 mm.

17. The carrier of claim 1, wherein the strengthened substrate has an average thickness of less than or equal to 1.5 mm.

18. The carrier of claim 1, wherein the strengthened substrate has an average thickness of less than or equal to 1.1 mm.

19. The carrier of claim 1, wherein the strengthened substrate is an ion exchange strengthened substrate.

20. The carrier of claim 1, wherein the strengthened substrate comprises a coefficient of thermal expansion greater than or equal to 9×10$^{-6}$K$^{-1}$ averaged over a temperature range from 20° C. to 300° C.

21. The carrier of claim 1, wherein the strengthened substrate comprises alkali aluminosilicate glass.

22. The carrier of claim 1, wherein the strengthened substrate has an in-process warp of less than or equal to 4,000 µm and greater than or equal to −9,000 µm.

23. The carrier of claim 1, wherein the strengthened substrate has an as-formed warp of greater than or equal to 0 µm and less than or equal to 500 µm.

* * * * *